United States Patent [19]
Pine et al.

[11] Patent Number: 5,784,103
[45] Date of Patent: Jul. 21, 1998

[54] CHARGE COUPLED IMAGING DEVICE HAVING AN ADJUSTABLE ASPECT RATIO AND CAMERA PROVIDED WITH SUCH A CHARGE COUPLED IMAGING DEVICE

[75] Inventors: Gregory E. Pine, Simi Valley, Calif.; Pieter P. Brouwer, Dordrecht, Netherlands; Petrus G. M. Centen, Rijen, Netherlands; Holger Stoldt, Eindhoven, Netherlands; Albert J. P. Theuwissen, Bree, Belgium

[73] Assignee: U.S. Philips Corporation, New York, N.Y.

[21] Appl. No.: 389,377

[22] Filed: Feb. 16, 1995

[30] Foreign Application Priority Data

Feb. 17, 1994 [BE] Belgium .................. 09400187

[51] Int. Cl.$^6$ .................................................. H04N 3/12
[52] U.S. Cl. .................. 348/312; 348/317; 348/445; 257/246
[58] Field of Search ........................ 348/445, 294, 348/312, 317; 257/246

[56] References Cited

U.S. PATENT DOCUMENTS

| | | | |
|---|---|---|---|
| 3,921,195 | 11/1975 | Smith et al. | 257/246 |
| 4,426,664 | 1/1984 | Nagumo et al. | 358/213 |
| 4,734,772 | 3/1988 | Akiyama | 348/445 |
| 5,414,463 | 5/1995 | Katoh et al. | 348/207 |
| 5,450,129 | 9/1995 | Matoba et al. | 348/294 |
| 5,486,859 | 1/1996 | Matsuda | 348/445 |
| 5,491,512 | 2/1996 | Itakura et al. | 348/445 |
| 5,510,836 | 4/1996 | Stelekenburg | 328/294 |

FOREIGN PATENT DOCUMENTS

| | | |
|---|---|---|
| 0523781 | 1/1993 | European Pat. Off. |
| 0547697 | 6/1993 | European Pat. Off. |
| 0625800 | 11/1994 | European Pat. Off. |

*Primary Examiner*—Wendy Garber
*Attorney, Agent, or Firm*—Steven R. Biren

[57] ABSTRACT

It is known to adjust the width/height ratio (aspect ratio) in charge coupled imaging devices in that a number of columns may or may not be used on either side of the imaging matrix. It is possible in this manner, for example, to reduce the aspect ratio to 4/3 starting from a device with an aspect ratio of 16/9 corresponding to a widescreen TV. Practice has shown that this reduction in the width impairs the quality of the imaging device in the 4/3 mode. According to an aspect of the invention, an FT device with an aspect ratio of 4/3 is used and operated as a 4-phase CCD in the 4/3 mode. To obtain the 16/9 aspect ratio, the height of the device is reduced in that selected lines are not used. For this purpose, the sensor matrix is operated as a 3-phase CCD, whereby the number of lines in vertical direction is increased. The aspect ratio surprisingly becomes substantially equal to 16/9, while the width remains the same and the number of lines in the vertical direction is constant, in that the excess lines are not used as video information. To operate the sensor matrix A as a 3-phase as well as a 4-phase CCD, the electrodes are interconnected by clock lines in the manner of a 12-phase CCD.

12 Claims, 4 Drawing Sheets

5,784,103

1

CHARGE COUPLED IMAGING DEVICE HAVING AN ADJUSTABLE ASPECT RATIO AND CAMERA PROVIDED WITH SUCH A CHARGE COUPLED IMAGING DEVICE

BACKGROUND OF THE INVENTION

The invention relates to a charge coupled imaging device comprising a semiconductor body which is provided at a surface with a matrix of image sensor elements, called sensor matrix, with a system of charge transport channels situated next to one another and extending in the semiconductor body parallel to one another and parallel to the surface, in which channels electric charge generated in the image sensor elements through absorption of radiation can be stored in the form of charge packages and transported to a read-out member under the influence of clock voltages applied to a system of clock electrodes formed above the charge transport channels.

The invention also relates to a camera provided with such an imaging device.

Such a device is known, for example, from the published European Patent Application EP-A 0 547 697 (PHN 13.926). A charge coupled imaging device is described therein whose ratio between the width and the height (aspect ratio) is variable, in particular adjustable between two standard values, i.e. 16/9 and 4/3. The value 4/3 corresponds to the hitherto usual aspect ratio of TV pictures. The value 16/9 corresponds to the aspect ratio of widescreen TV. For recording purposes, it offers considerable advantages to use a camera which can be set for either of these standard values. The cited European Patent Application EP-A 0 547 697 accordingly proposes to use an imaging device in the 16/9 version and to use all columns thereof in widescreen applications. For applications in the 4/3 standard, on the other hand, the columns in two bands situated at the left and right edges of the matrix are not used for active video information. The signals in these columns are, for example, discharged through the read-out register in the line retrace period. A disadvantage of this is that the number of pixels per line changes, which means that the camera frequency changes, given an equal line time, which again leads to disadvantages for the signal processing. In addition, this conversion leads to a loss in horizontal resolution and a change in the horizontal viewing angle. Generally speaking, a convertible imaging device of this known type is optimized for the 16/9 aspect ratio, but shows a less satisfactory operation in the 4/3 mode.

SUMMARY OF THE INVENTION

The invention has for its object inter alia to provide such a charge coupled imaging device which can be operated both in the 16/9 and in the 4/3 mode and whose width in the 4/3 mode is equal to the width in the 16/9 mode, so that accordingly the number of pixels per line does not change. The invention further has for its object to provide a charge coupled imaging device whose height is adjustable at a constant number of lines and at a constant horizontal viewing angle. The invention in addition envisages to provide a charge coupled imaging device in which the number of lines is adjustable.

A charge coupled imaging device according to the invention is characterized in that means are present by which the device can be operated as desired, at least during charge transport, as an M-phase charge coupled device, in which a charge package corresponds to M clock electrodes, or as an N-phase charge coupled device, in which a charge package

2 corresponds to N clock electrodes, N being smaller than M. The change in the number of phases also changes the height of the pixels. As a result, the number of image lines can be varied through the choice of the phase for a given number of clock electrodes. By switching to a lower number of phases, whereby the number of image lines is increased, and by not using the surplus image lines as active video information, it is possible to vary the height of the image matrix, and thus the height/width ratio, while the number of image lines remains the same. Since the width of the image does not change, problems as described above are avoided.

A major embodiment of a device according to the invention is characterized in that the width/height ratio in M-phase operation is equal to or at least substantially equal to 4/3, and in N-phase operation equal to or at least substantially equal to 16/9. The imaging device may advantageously be optimized for the 4/3 mode. Since the 16/9 mode involves a reduction of the image in vertical direction, this is generally perceived as much less unpleasant than if, as in the known device, a wide image is made narrower for the 4/3 mode and contains fewer pixels in the horizontal direction.

An important preferred embodiment of an imaging device according to the invention is characterized in that M and N are equal to four and three, respectively. It is surprisingly found in this version that the aspect ratio of 4/3 in 4-phase operation becomes substantially 16/9 in 3-phase operation while the number of image lines remains the same. An embodiment which renders it possible to operate the charge coupled device as a 4-phase and as a 3-phase system without complicated circuits and/or wiring is characterized in that the electrodes are interconnected so as to form a 12-phase charge coupled device.

The invention may be advantageously used in devices in which the charge packages generated in the sensor matrix are directly read out from the matrix. A type of charge coupled imaging devices for which the invention is of particular importance is characterized in that the imaging device is of the frame transfer (FT) type and comprises, in addition to the sensor matrix of image sensor elements, a memory and a read-out register coupled thereto, the charge packages being transported into the memory via the charge transport channels after an integration period and being transported line by line from the memory to the read-out register through which the charge packages of one line are transported to read-out means. In a first type, the memory may be provided with the same number of image lines as the sensor matrix during operation in the 4/3 mode, while any excess image lines are directly discharged, for example through the read-out register, upon the transport of the information into the memory. In certain versions this is not possible, however, for example in versions in which a line is provided on the boundary between the sensor matrix and the memory, which line is masked against incident radiation and is used as a black reference. The charge collected in this line during an integration period forms a measure for the dark current stored in a memory and subtracted from the signals during signal processing. Since this line is to be read out in a normal manner via the read-out register, said excess lines must also be stored in the memory section in the 16/9 mode. Accordingly, a preferred embodiment of an imaging device according to the invention is characterized in that the memory comprises more storage locations than the maximum number of charge packages in the case of M-phase operation of the matrix.

It is possible in some versions to remove charge packages in a manner other than through the read-out register. Thus, for example, many commercially available charge coupled imaging devices with n-type buried channels are now provided with an n-type substrate which is used as a drain for electrons in the case of over-illumination. Excess charge packages may also be drained off through this substrate, for example by means of a voltage pulse applied to the electrodes of the sensor matrix. This may be advantageously utilized in that excess lines are not transported into the memory but are removed through the substrate after the active video information has been put in the memory. A further embodiment of a device according to the invention, which offers the advantage of a saving in space, is characterized in that the number of storage locations in the memory is smaller than the maximum number of charge packages formed during N-phase operation of the device.

It may be advantageous in some applications to remove excess lines situated in a single, comparatively wide band at one side of the sensor matrix as unnecessary information during operation in the 16/9 mode. A preferred embodiment is characterized in that excess image lines are obtained during N-phase operation compared with the number of image lines during M-phase operation, the charge packages in two bands of image lines not being used as video information during N-phase operation, each band having a width equal or substantially equal to half said excess image lines, while a first band is situated at the edge of the sensor matrix adjoining the memory and the other band is situated at the opposite edge of the sensor matrix. Since two comparatively narrow bands are removed from the image at two sides, the shift in the optical center is negligibly small in vertical direction, at least much smaller than if a comparatively wide band were removed at one side. In addition, the charge packages in said other band of excess lines may readily be removed through the substrate instead of through the read-out register in this embodiment.

The memory may also be switchable between 4-phase and 3-phase operation, similarly to the sensor matrix. To keep the number of contact pads in certain embodiments as low as possible, however, the memory is preferably operated as a 4-phase device both during 4-phase operation and during 3-phase operation of the sensor matrix.

BRIEF DESCRIPTION OF THE DRAWING

The invention will be explained in more detail with reference to an embodiment and the accompanying diagrammatic drawing, in which.

DESCRIPTION OF THE PREFERRED EMBODIMENTS

Figure 1:
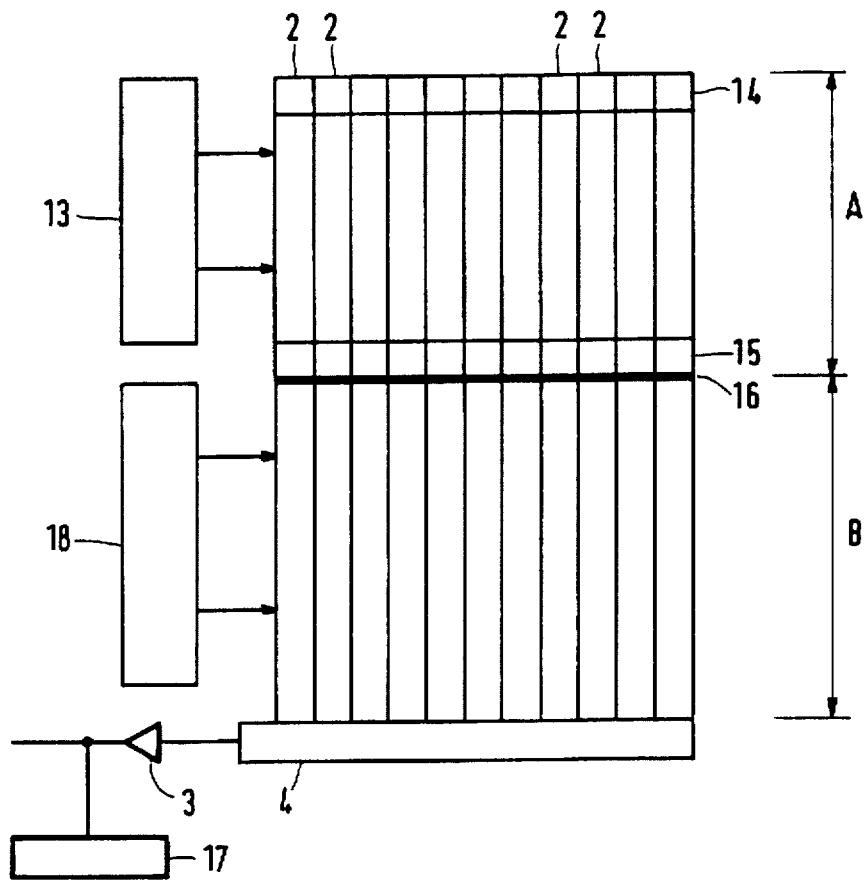
FIG. 1 diagrammatically shows an FT imaging device according to the invention.

FIGS. 1–4 diagrammatically show a charge coupled imaging device according to the invention of the FT type known from the literature. The device comprises a semiconductor body 1, which is usually made of silicon and is provided at its surface with a system of charge transport channels 2 which are situated next to one another and which extend in the semiconductor body parallel to one another and parallel to the surface 2. Only eleven channels 2 are shown in FIG. 1, but it will be apparent that in actual fact this number will be much greater. The channels 2, or at least the portion of the system of channels indicated with A, form a matrix, a sensor matrix hereinafter, of image sensor elements or pixels. As is generally known, charge carriers generated through absorption of locally incident electromagnetic radiation during an integration period are stored in the nearest pixel during operation. The charge packages thus formed are transported line by line through the channels 2 to a horizontal output register 4 after the integration period, and transported through register 4 to an output, where they are read out by means of a read-out member, for example an output amplifier 3. In certain versions of the imaging device according to the invention, the output register 4 directly adjoins the sensor matrix A. In the present embodiment of an FT device, the portion B of the channels 2 situated between the sensor matrix A and the output register 4 is used as a memory. After the integration period, the charge packages are quickly transported into the memory B as a raster and read out from the memory via the register 4, while a new image is being received in the sensor matrix A.

Figure 3:
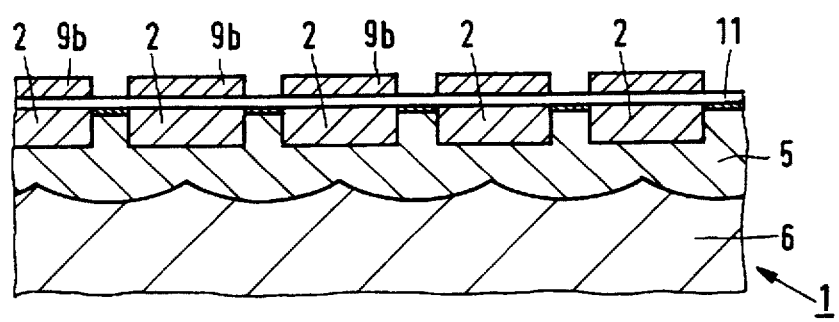
FIG. 3 is a cross-section of this device taken on the line III—III in FIG. 2.
Figure 4:
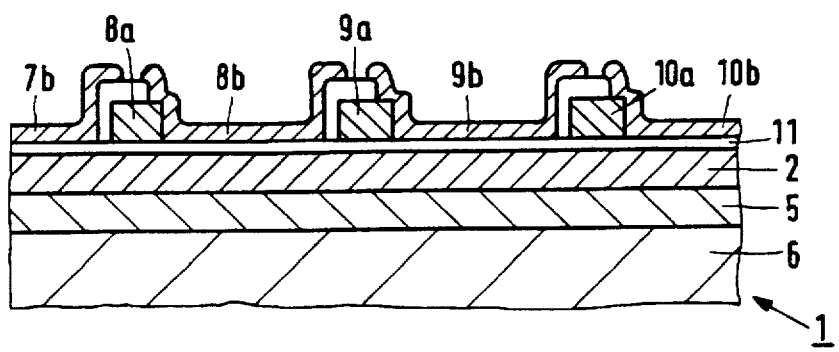
FIG. 4 is a cross-section of this device taken on the line IV—IV in FIG. 2.

The charge coupled device in this example is of the buried channel type, in which the channels 2 are formed by n-type surface zones in which the storage of information takes place in the form of packages of electrons, as can be seen in FIGS. 3 and 4. The n-type channels 2 are bounded in the semiconductor body by a p-type region 5 which separates the channels 2 from a subjacent n-type substrate region 6. As is known, excess charge carriers caused, for example, by excess illumination can be removed through this substrate (anti-blooming), for which purpose the p-type zone 5 is sufficiently thin at least below the zones 2 in order to obtain a potential barrier between the zones 2 and the substrate 6 which is lower than the potential barrier between mutually adjacent pixels in a same column. Obviously, alternative anti-blooming methods which are known per se may be used. It will in addition be apparent that the invention is also applicable in charge coupled devices with surface transport.

Figure 2:
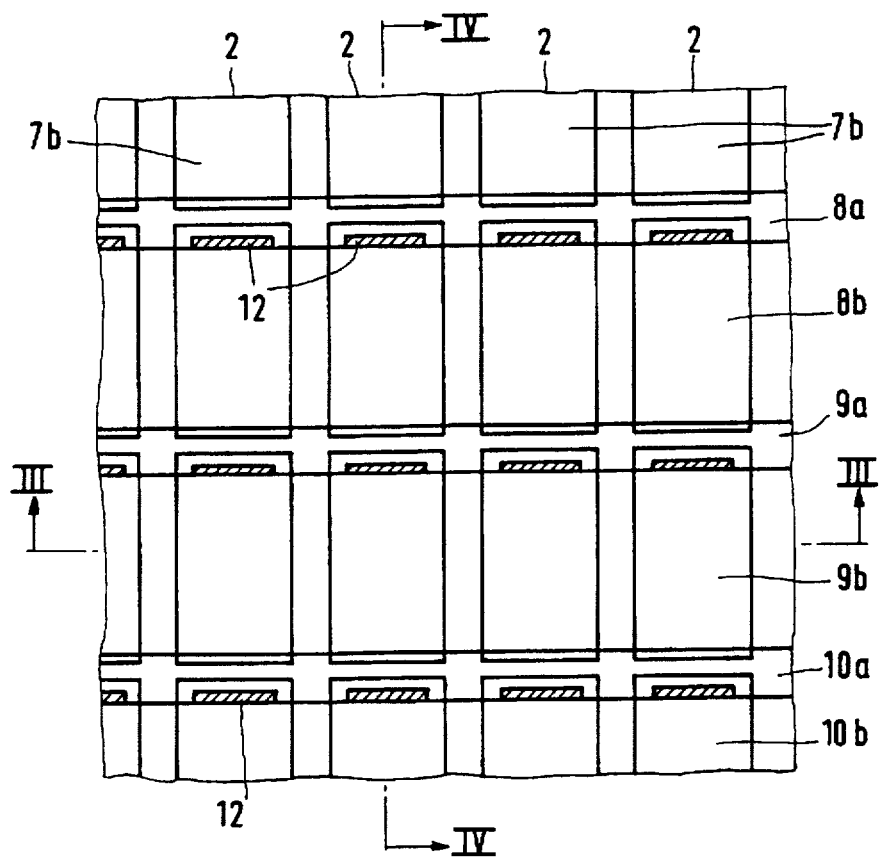
FIG. 2 is a plan view of the electrode configuration in the imaging section of this device.

The surface of the semiconductor body is provided with a system of clock electrodes of which the electrodes 7–10 are shown in FIGS. 2–4. The electrodes are insulated from the surface of the semiconductor body in usual manner by means of a thin insulating layer 11, usually made of silicon oxide or a combination of silicon oxide and silicon nitride. A configuration is used for the clock electrodes in this example as has been described inter alia in European Patent Application 932014-63.2, filed 21 May 1993 by Applicant. The electrodes are composed of strips 8a, 9a, 10a, etc. of n-type doped, comparatively thick polycrystalline silicon (poly), and of portions 7b, 8b, 9b, 10b, etc. of n-type doped comparatively thin poly. The strips extend transversely across the matrix and are connected at the matrix edge to means for applying clock voltages, which will be discussed further below. To obtain a sufficiently low resistance, the thickness of the poly strips a is comparatively great, for example 300 nm. The portions b of the clock electrodes consist of poly with a thickness of no more than approximately 50 nm. Owing to the small poly thickness, the light transmission of the portions 7b, 8b, 9b, etc., and thus the sensitivity of the imaging device are very high. Through contact windows 12, the thin poly portions b are connected to the strips a which have a width, seen in the charge transport direction, much smaller than that of the thin poly portions b, and which thus have only a small influence on the sensitivity. As is shown in the drawing, the electrodes 7b, 8b, 9b, etc. are each formed by fingers, each of which extends above a CCD channel, while mutually adjoining fingers are separated by a space which is entirely devoid of poly material and which forms a window for the incident radiation through which the radiation can reach the semiconductor body practically unhampered. When less stringent requirements are imposed on the sensitivity, it is also possible to construct the poly portions b of each electrode as a continuous strip. As is apparent from the drawing, the electrodes are entirely or at least substantially entirely of the same shape, so that, for example, flicker such as field flicker in interlined read-out is avoided.

Means 13 (FIG. 1) are present for controlling the clock electrodes of the sensor matrix such that the latter may be operated as desired either as an M-phase charge coupled device or as an N-phase charge coupled device, N being smaller than M. In the present example, M and N are 4 and 3, respectively. It is possible to adjust the size of the pixels and thus of the number of lines through the phase adjustment. This is utilized in the present example for switching the aspect ratio, i.e. the ratio between the width and the height of the sensor matrix, between 4/3 and 16/9, while the width and the number of lines remain the same. If a 4/3 aspect ratio is required, the entire sensor matrix A is used and operated as a 4-phase device. A 16/9 aspect ratio is obtained in that the sensor matrix is operated as a 3-phase device and the height of the sensor matrix is reduced in that the number of extra lines compared with 4-phase operation is not used as active video information. These excess lines are localized in two equally large or at least substantially equally large regions 14 and 15 at the top and bottom of the sensor matrix. At least one line 16 masking against incident radiation is present in the sensor matrix between the region 15 and the memory matrix B, for example, by means of an Al screen, used as a black reference and indicated with a black line in FIG. 1. Such a reference line may also be provided at the upper side of the sensor matrix, if so desired. The charge packages formed in this line during the integration period are the result of leakage current, which is to be subtracted from the signal packages. The information of line 16 is, for example, read out through the output amplifier 3 for this purpose and stored in a memory 17 depicted diagrammatically only in FIG. 1.

The memory matrix B is controlled by means 18 which operate the memory matrix as a 4-phase CCD both in the situation in which the matrix A is operated as a 4-phase device and in the situation in which the matrix A is operated as a 3-phase CCD. The number of lines in the memory B is chosen to be equal or at least substantially equal to the number of lines in the sensor matrix in the 3-phase mode diminished by the number of lines in the region 14 at the upper side of the sensor matrix. During transport of a raster from the imaging section A into the memory B in the 16/9 mode, the reference line 16, the excess lines or non-active lines 15, and the active lines are transported from the sensor matrix into the memory B, the non-active lines from region 14 being stored in the region 15. During read-out, first the information from line 16 is read out via the register 4 in conventional manner and stored in the memory 17. Then the non-active lines from the region 15 can be discharged via the register 4. Since these charge packages are not used, it is not necessary to operate the memory in synchronity with the output register during this time. If more charge is transported in the output register than can be accommodated in the output register during this time, for example for quickly removing this charge, it is possible to remove an excess charge through the substrate. After reading-out of the active lines via the register 4 and the output amplifier 3, the non-active lines from the region 14 can be removed, for example, through the output register 4. Advantageously, however, the lines from the region 14 may also be removed through the n-type substrate 6, for example by means of a negative pulse on the electrodes of the memory B, which means that no or at least substantially no delay is introduced for the removal of these lines. Preferably, the read-out of the reference line 16 and the removal of the non-active lines from the region 15 take place in a time interval which corresponds to the vertical retrace time of a TV picture.

It is noted that in the absence of a reference line 16 the non-active lines 15 may be removed directly through the output register 4 in the case of frame transport, so that they require no storage space in the memory B, and the memory may be smaller than in the embodiment drawn with the reference line 16.

Figure 5:
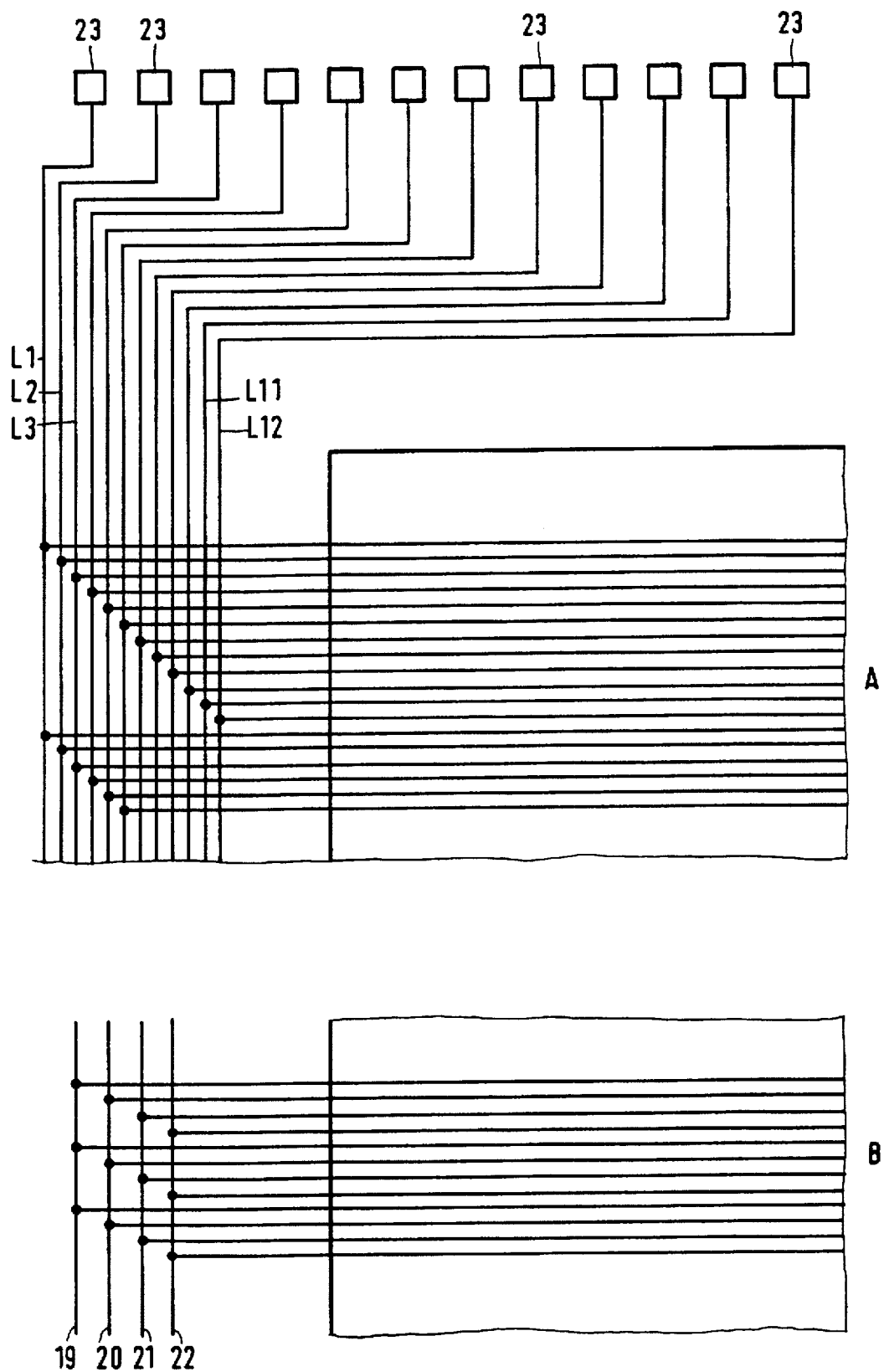
FIG. 5 is a plan view of a portion of the imaging section and the memory section of the device of FIG. 1.
Figure 7:
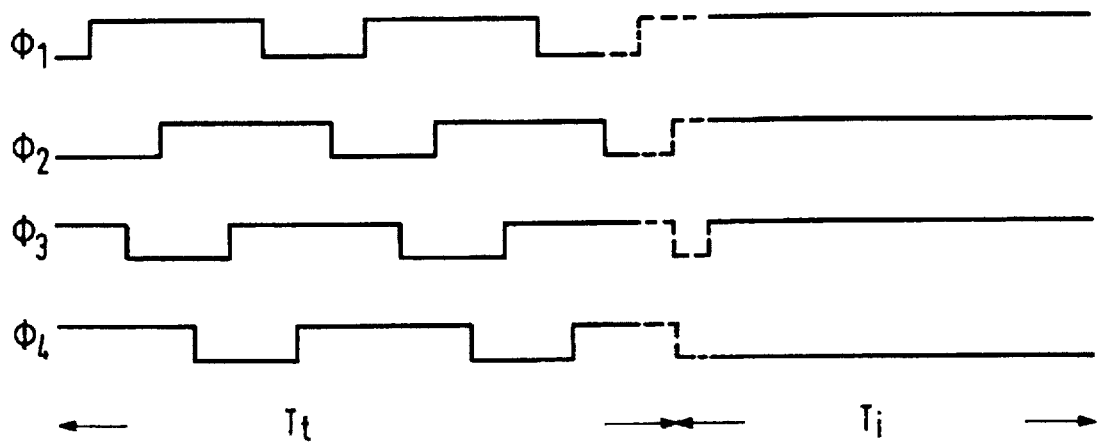
FIG. 7 is a diagram representing 4-phase clock voltages applied to this device in the case of a 4/3 aspect ratio.
Figure 8:
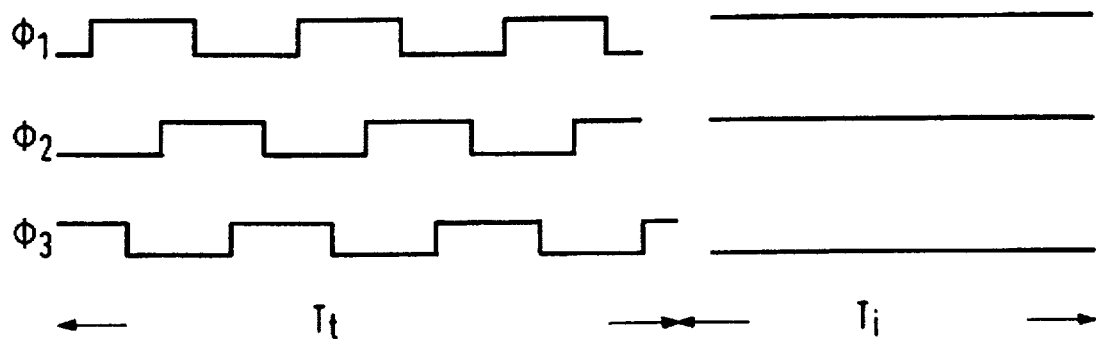
FIG. 8 is a diagram representing 3-phase clock voltages applied in the case of a 16/9 aspect ratio.

The memory matrix B and the horizontal output register 4 are controlled in a usual manner. This is diagrammatically depicted in FIG. 5 for the memory by means of the four clock lines 19–22 which are connected alternately to a clock electrode of the memory section and which are connected to a 4-phase clock voltage source. The clock electrodes of the imaging section A are alternately connected to one of twelve clock lines L1, L2, L3, . . . , L11, L12 in the manner of a 12-phase system. The clock lines L1–L12 are connected to contact pads 23 through which 3-phase or 4-phase clock voltages originating from an external voltage source are supplied. In FIG. 7, the clock voltages $\phi_1$–$\phi_4$ are plotted as a function of time for 4-phase operation, $T_t$ and $T_i$ being the transport phase and the integration period, respectively, in a raster. Phase $\phi_1$ is applied to the clock lines L1, L5 and L9; phase $\phi_2$ to the clock lines L2, L6 and L10; phase $\phi_3$ to the clock lines L3, L7 and L11; and phase $\phi_4$ to the clock lines L4, L8 and L12. FIG. 8 shows the clock voltages $\phi_1$, $\phi_2$ and $\phi_3$ as a function of time in 3-phase operation. Phase $\phi_1$ is applied to the clock lines L1, L4, L7 and L10; phase $\phi_2$ to the clock lines L2, L5, L8 and L11; and phase $\phi_3$ to the clock lines L3, L6, L9 and L12. It is apparent therefrom that electrodes to which the same clock voltage is to be applied both in 3-phase operation and in 4-phase operation are interconnected by a clock line li (i=1, 2, 3, . . .), whereas electrodes to which no common clock voltage is applied in 3-phase operation and 4-phase operation are not interconnected by a clock line.

Figure 6:
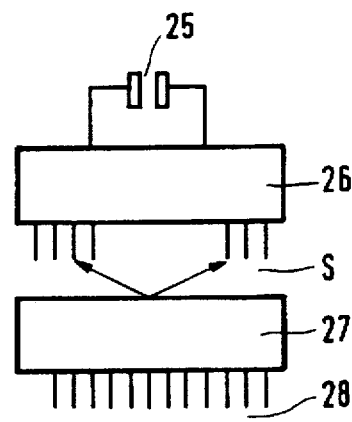
FIG. 6 diagrammatically depicts means for generating clock voltages for this device.

FIG. 6 diagrammatically shows an adjustable clock voltage source capable of applying 3-phase and 4-phase clock voltages. The source comprises a crystal oscillator 25 whose vibrations are converted into 3-phase and 4-phase clock signals, for example, by means of a PLD circuit 26 (Programmable Logic Device). The 3-phase or 4-phase mode can be selected with switch S. The demultiplexing circuit 27 generates 3-phase or 4-phase clock voltages of the desired shape which are applied to the twelve output terminals 28. The terminals 28 are each connected to one of the connection contact pads 23.

If a complete image is to be sensed with a single raster, the image sensor matrix comprises besides the black reference line(s) 16, for example, 588 lines of active video information with 1000 pixels per line. Four electrodes per pixel are necessary for 4-phase operation in the vertical direction, so that the number of electrodes of the imaging matrix is 2352. The dimensions are so chosen that the width/height ratio of the sensor matrix is 4/3. During the integration period Ti, for example, three phases of each pixel are set for a positive voltage, in FIG. 7 the phases $\phi_1$, $\phi_2$ and $\phi_3$, while the phase $\phi_4$ is low. The phases $\phi_1$, $\phi_2$, $\phi_3$ induce potential wells in which electrons are collected and stored, whereas $\phi_4$ induces potential barriers which separate pixels from one another within a column. Each charge package also corresponds to 4 electrodes in the transport phase $T_r$. In the 3-phase mode (FIG. 8), each pixel corresponds to 3 electrodes. In the integration period $T_i$, for example, $\phi_1$ and $\phi_2$ are at the high, charge-integrating level, whereas $\phi_3$ is at the low level for separating pixels. In the 3-phase mode, the 2352 electrodes of the sensor matrix correspond to 784 lines, so that there are approximately 200 excess lines. The width of the regions 14 and 15 indicated in FIG. 1 then is approximately 100 lines each. It is readily deduced that these excess lines correspond approximately to ¼ of the original height of the sensor matrix. Since the height is ¾ of the width, the height of the active portion of the sensor matrix in 3-phase operation is at least substantially only 9/16 of the width of the sensor matrix, which corresponds exactly to the standard aspect ratio of widescreen TV. It is noted in this connection that the matrix width does not change upon the switch-over from the one mode to the other mode, and accordingly neither does the viewing angle in horizontal direction. The number of pixels per line does not change, nor does the signal frequency per line as a result. In addition, the number of lines in the vertical direction does not change, so that the device complies with the relevant TV standard in both modes.

The embodiment described here is a so-called progressive-scan imaging device in which the number of lines is the same as the number of lines in a display device such as a TV set. The invention, however, may also be applied in charge coupled imaging devices comprising approximately half this number of lines, for example, 300 lines. Half a TV raster of 600 lines may be recorded with these 300 lines in an integration period. It is usual to record two half rasters in two consecutive integration periods so as to obtain a full raster such that these rasters are vertically shifted over a distance of half a pixel (interlacing). This may be effected in a simple manner in the 4-phase mode in that, for example, charge is integrated below the phases $\phi_1$, $\phi_2$ and $\phi_3$ in the first half raster, while phase $\phi_4$ is used for inducing the barriers between the pixels, and in that charge is integrated below the phases $\phi_3$, $\phi_4$ and $\phi_1$ in the second half raster, while the phase $\phi_2$ is used for the barriers between the pixels. Since the electrodes are all substantially the same shape, no or at least substantially no noise or other imperfections such as the field flicker mentioned above are introduced by this shifting of pixels. The situation is more complex in the 3-phase mode to the extent that it is not possible now to shift the pixels stationarily over a distance of half a pixel, because there are only 3 electrodes present for each pixel. In this case the method may be used described in published European Patent Application 0 523 781, the contents of which should be deemed to be included in the present Application by reference. Said published EP Application discloses a 3-phase charge coupled imaging device in which two rasters sensed consecutively are effectively shifted relative to one another over a distance of half a pixel in that the charge is shifted to and fro in the integration period, so that the location of the center of gravity of the pixel is determined by the direction in which the charge is shifted and by the duration of storage of the charge in a certain location. By displacing the charge in a different direction in the first half raster compared with the other half raster it is possible, as calculations show, to shift the center of gravity of a certain pixel over a distance of half a pixel, i.e. over a distance of 1.5 electrode, relative to the other half raster.

It will be apparent that the invention is not limited to the embodiments described here. Thus the invention may be used in a charge coupled device with surface transport. In the embodiment described, the transition between 4-phase operation and 3-phase operation is used for adjusting the width/height ratio. Instead, the invention may be used, for example, for adjusting the number of lines of the sensor matrix and thus, for example, the vertical resolution while the width/height ratio remains the same.

It is also possible to provide a drain at the upper side of the sensor matrix A in FIG. 1, so that the transport direction in the region 14 is reversed during raster transport in the 16/9 mode. The invention may further be advantageously used in other types of charge coupled imaging devices than the FT imaging device described here, for example, in imaging devices in which the integration of the photocurrent in the charge transport channels and the generation of charge are carried out substantially separately from the transport channels.

We claim:

1. A charge coupled imaging device comprising a semiconductor body which is provided at a surface with a sensor matrix of image sensor elements, with a system of charge transport channels situated next to one another and extending in the semiconductor body parallel to one another and parallel to the surface, in which channels electric charge generated in the image sensor elements through absorption of radiation can be stored in the form of charge packages and transported to a read-out member under the influence of clock voltages applied to a system of clock electrodes formed above the charge transport channels, characterized in that means are provided for selectable operating said device as an M-phase charge coupled device, in which a charge package corresponds to M clock electrodes, or as an N-phase charge coupled device, in which a charge package corresponds to N clock electrodes, N being smaller than M, for adjusting a width/height ratio of the imaging device.

2. A charge coupled imaging device as claimed in claim 1, characterized in that the width/height ratio of the imaging device is adjustable by selecting the number of phases, while the number of image lines remains the same.

3. A charge coupled imaging device as claimed in claim 2, characterized in that the width/height ratio in M-phase operation is or to or at least substantially equal to 4/3, and in N-phase operation is at least substantially equal to 16/9.

4. A charge coupled imaging device as claimed in claim 1, characterized in that M and N are equal to four and three, respectively.

5. A charge coupled imaging device as claimed in claim 4, characterized in that the electrodes are interconnected so as to form a 12-phase charge coupled device.

6. A charge coupled imaging device as claimed in claim 1, characterized in that the imaging device is of the frame transfer (FT) type and further comprises, a memory matrix and a read-out register coupled thereto, the charge packages being transported into the memory via the charge transport channels after an integration period and being transported line by line from the memory matrix to the read-out register through which the charge packages of one line are transported to read-out means.

7. A charge coupled imaging device as claimed in claim 6, characterized in that the memory matrix comprises more storage locations than the maximum number of charge packages for M-phase operation of the sensor matrix.

8. A charge coupled imaging device as claimed in claim 7, characterized in that the number of storage locations in the memory matrix is smaller than the maximum number of charge packages formed during N-phase operation of the device.

9. A charge coupled imaging device as claimed in claim 6, characterized in that excess image lines are obtained during N-phase operation of the sensor matrix compared with the number of image lines during M-phase operation, the charge packages in two bands of image lines not being used as video information during N-phase operation, each band having a width substantially equal to half said excess image lines, a first of said two bands being situated at an edge of the sensor matrix adjoining the memory and a second of said two bands being situated at an opposite edge of the sensor matrix.

10. A charge coupled imaging device as claimed in claim 9, characterized in that, during the transfer of charge packages from the sensor matrix to the memory, matrix the first band of excess lines is transferred to the memory matrix in order to be removed through the read-out register, and the second band of excess lines is removed from the sensor matrix to a region situated below the sensor matrix and separated from the transport channels of the sensor matrix by at least a pn junction.

11. A charge coupled imaging device as claimed in claim 6, characterized in that the memory matrix is formed by an M-phase charge coupled device.

12. A camera comprising a charge coupled imaging device having a semiconductor body which is provided at a surface with a sensor matrix of image sensor elements, with a system of charge transport channels situated next to one another and extending in the semiconductor body parallel to one another and parallel to the surface, in which channels electric charge generated in the image sensor elements through absorption of radiation can be stored in the form of charge packages and transported to a read-out member under the influence of clock voltages applied to a system of clock electrodes formed above the charge transport channels, characterized in that means are provided for selectably operating said device as an M-phase charge coupled device, in which a charge package corresponds to M clock electrodes, or as an N-phase charge coupled device, in which a charge package corresponds to N clock electrodes, N being smaller than M, for adjusting a width/height ratio of the imaging device.

* * * * *